(12) United States Patent
Tao et al.

(10) Patent No.: US 9,208,841 B2
(45) Date of Patent: Dec. 8, 2015

(54) TRACKING CIRCUIT

(71) Applicant: TAIWAN SEMICONDUCTOR MANUFACTURING COMPANY, LTD., Hsinchu (TW)

(72) Inventors: Derek C. Tao, Fremont, CA (US); Annie-Li-Keow Lum, San Jose, CA (US); Kuoyuan (Peter) Hsu, San Jose, CA (US)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 13/840,668

(22) Filed: Mar. 15, 2013

(65) Prior Publication Data
US 2014/0269026 A1 Sep. 18, 2014

(51) Int. Cl.
*G11C 7/22* (2006.01)
*G11C 11/419* (2006.01)

(52) U.S. Cl.
CPC .............. *G11C 7/227* (2013.01); *G11C 11/419* (2013.01)

(58) Field of Classification Search
CPC ........................................................ G11C 7/22

USPC .......................................................... 365/194
See application file for complete search history.

(56) References Cited

U.S. PATENT DOCUMENTS

| | | | | |
|---|---|---|---|---|
| 2005/0185468 | A1* | 8/2005 | Hosono et al. | 365/185.22 |
| 2009/0116292 | A1* | 5/2009 | Maejima et al. | 365/185.23 |
| 2009/0116305 | A1* | 5/2009 | Son et al. | 365/189.09 |
| 2009/0231937 | A1* | 9/2009 | Jung et al. | 365/194 |
| 2012/0033491 | A1* | 2/2012 | Shelton et al. | 365/185.2 |
| 2012/0260046 | A1* | 10/2012 | Lemonovich et al. | 711/147 |

\* cited by examiner

*Primary Examiner* — Min Huang
(74) *Attorney, Agent, or Firm* — Hauptman Ham, LLP

(57) ABSTRACT

A circuit is in a memory macro and comprises a write path, a read path, a selection circuit, and a clock generator circuit. The write path includes a first signal generated based on a first edge of a clock signal in a write operation of the memory macro. The read path includes a second signal generated based on a first edge of the clock signal in a read operation of the memory macro. The selection circuit is configured to select the first signal as a third signal in the write operation of the memory macro, and to select the second signal as the third signal in the read operation of the memory macro. The clock generator circuit is configured to generate a second edge of the clock signal in the write operation or in the read operation based on the third signal.

20 Claims, 14 Drawing Sheets

TRACKING CIRCUIT

FIELD

The present disclosure is related to a tracking circuit.

BACKGROUND

In an approach related to a memory macro using single port memory cells, a tracking circuit is provided for either a write operation or a read operation to track signals for both the write and the read operations. In such an approach, the circuit is designed for the worst-case time delay of the write or the read operation. For example, if a time delay of the write operation is worse than the time delay of the read operation, the tracking circuit is designed based on the time delay of the write operation. But if the time delay of the read operation is worse than the time delay of the write operation, the tracking circuit is designed based on the time delay of the read operation. As technologies advance, such as to 28 nm node or below, it is not easy to determine which time delay of the write operation or of the read operation is worse than the other one.

BRIEF DESCRIPTION OF THE DRAWINGS

The details of one or more embodiments of the disclosure are set forth in the accompanying drawings and the description below. Other features and advantages will be apparent from the description, drawings, and claims.

Like reference symbols in the various drawings indicate like elements.

DETAILED DESCRIPTION

Figure 1A:
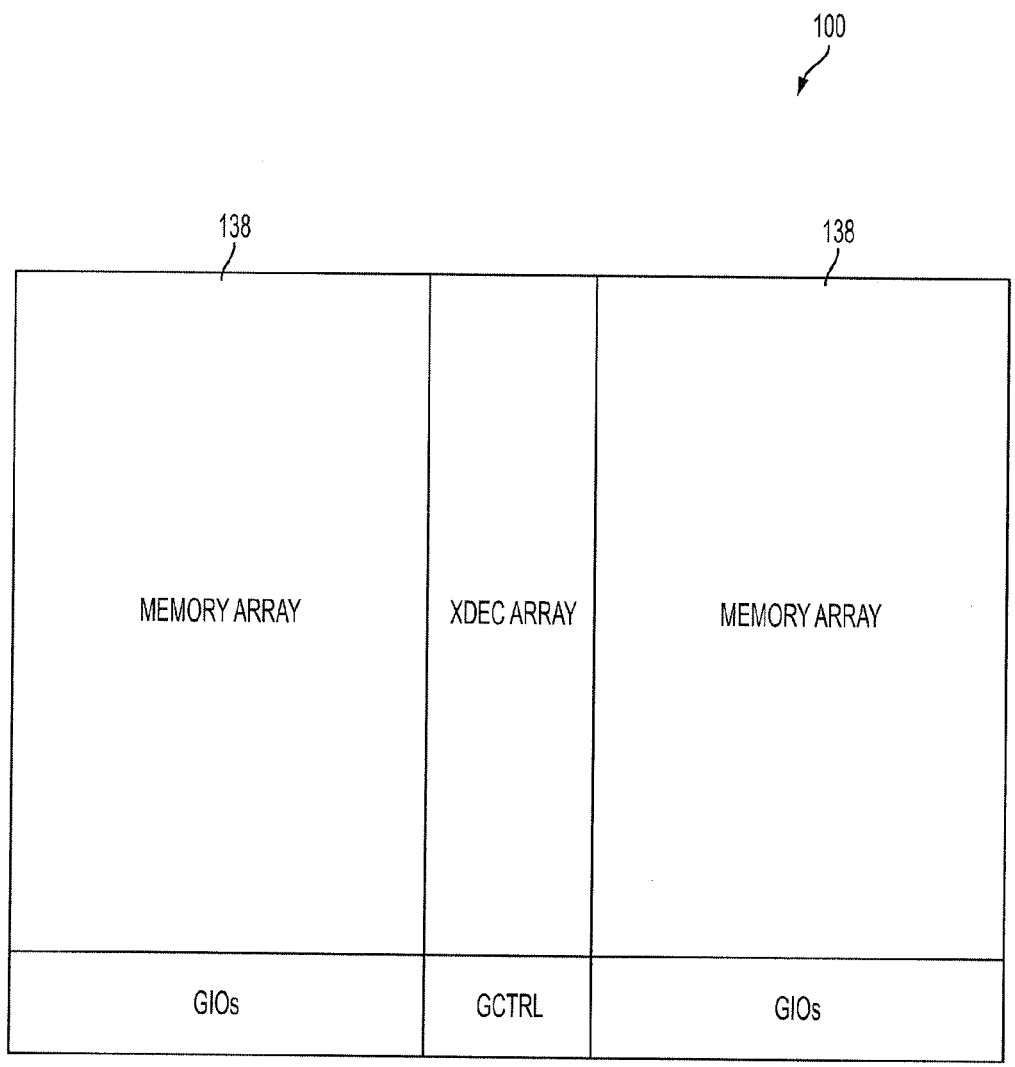
FIG. 1A is a diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. In some embodiments, a tracking circuit is designed for both a write operation and a read operation of a memory macro. For example, when the memory macro operates in a write operation, the tracking circuit uses a write tracking path. In contrast, when the memory macro operates in a read operation, the tracking circuit uses a read tracking path. Effectively, the tracking circuit is designed to separately track write and read behaviors and time delays of circuit elements of the memory macro. In some embodiments, many circuits are used in both the write and the read tracking paths. As a result, a circuit area for the memory macro using the tracking circuit is reduced compared with the situation in which circuits used in a write operation are different from circuits used in a read operation.

Memory Macro

FIG. 1A is a diagram of a memory macro 100 in accordance with some embodiments. Memory macro 100 is a static random access memory (SRAM) macro, and is used for illustration. Other types of memories are within the contemplated scope of the present disclosure.

Memory macro 100 is symmetrical. For example, with reference to an X-Decode (XDEC) array or a global control circuit (GCTRL), circuit elements on the left side of memory macro 100 are similar to circuit elements on the right side of memory macro 100. For another example, memory macro 100 includes two memory arrays 138. One memory array 138 is on the left side of memory macro 100 and one memory array 138 is on the right side of memory macro 100. Memory cells in each of memory arrays 138 are arranged in rows and columns. A memory cell is described with reference to FIG. 1B below.

XDEC array includes address decoders to identify memory cells in the row or X directions of the memory macro, control circuits to control inputs and outputs of memory cells in memory arrays 138, etc.

A plurality of global input-output circuit GIOs serves to transfer data between memory cells in a corresponding memory array 138 and other circuits outside of memory macro 100.

Global control GCTRL provides the row address, the column address pre-decode, clock, and other signals for memory macro 100. Global control GCTRL also controls data transfer between memory cells in memory arrays 138 and circuits outside of memory macro 100.

Memory Cell and Tracking Cells

Figure 1B:
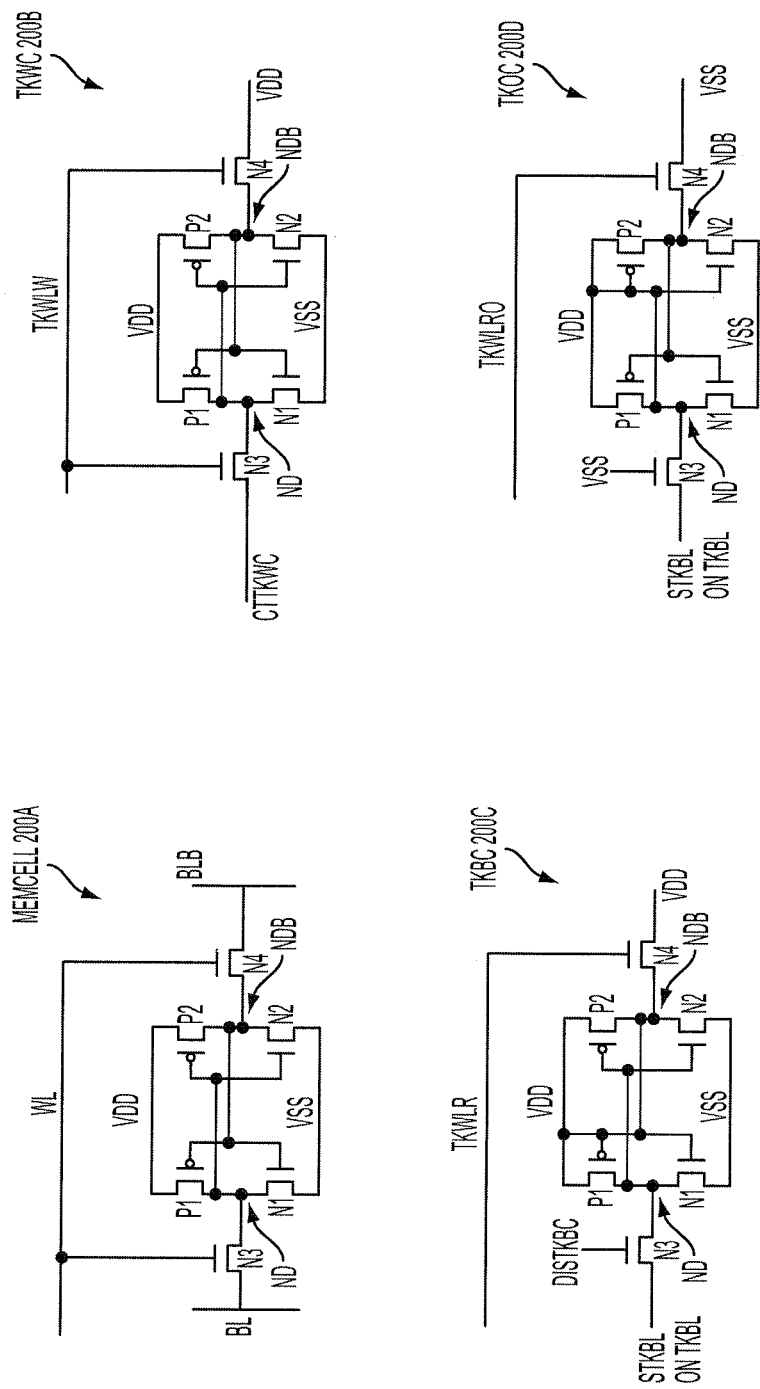
FIG. 1B is diagrams of various cells used in a tracking circuit of the memory macro in FIG. 1A and/or in the memory macro, in accordance with some embodiments.

FIG. 1B are diagrams of a memory cell (MEMCELL) 200A, a tracking word cell (TKWC) 200B, a tracking bit cell (TKBC) 200C, and a tracking off cell (TKO) 200D, in accordance with some embodiments.

Memory cell 200A includes two P-type metal oxide semiconductor (PMOS) transistors P1 and P2, and four N-type metal oxide semiconductor (NMOS) transistors N1, N2, N3, and N4. Transistors P1, P2, N1, and N2 form a cross latch. Drains of transistors P1 and N1 are coupled together and form a node ND. Drains of transistors P2 and N2 are coupled together and form a node NDB. Gates of transistors P1 and N1 are coupled together and with drains of transistors P2 and N2. Gates of transistors P2 and N2 are coupled together and with drains of transistors P1 and N1.

A word line WL is coupled with a gate of each of transistors N3 and N4. In a row of memory cells 200A, word line WL is coupled with a gate of each of transistors N3 and N4 of a plurality of memory cells in the row of memory cells. Word line WL is also called a control line because the signal on word line WL turns on transistors N3 and N4 for data on bit lines BL and BLB to be transferred from and to corresponding nodes ND and NDB, or turns off transistors N3 and N4 to electrically isolate bit lines BL and BLB and corresponding nodes ND and NDB.

Drains of each of transistors N3 and N4 are coupled to bit lines BL and BLB, respectively. In a column of memory cells 200, bit lines BL and BLB are coupled with each drain of transistors N3 and N4 of a plurality of memory cells 200A in the column of memory cells 200A. Each of bit lines BL and BLB is also called a data line because data carried on bit lines BL and BLB are written to and read from corresponding nodes ND and NDB.

In a write operation of memory cell 200A, in some embodiments, bit lines BL and BLB are applied with logical values to be written to corresponding nodes ND and NDB. Word line WL is then activated to turn on transistors N3 and N4, which transfer the data on bit lines BL and BLB to corresponding nodes ND and NDB.

In a read operation, bit lines BL and BLB are pre-charged to a high logical value. Word line WL is then activated to turn on transistors N3 and N4. The data in nodes ND and NDB are therefore transferred to bit lines BL and BLB. Based on a low logical value of the data stored in a corresponding node ND or node NBD, one bit line is pulled towards a low logical value and the other bit line remains at the same pre-charged high logical value. In other words, a bit line split between bit lines BL and BLB develops. When the bit line split is sufficiently large, a sense amplifier is turned on to sense the bit line split between bit lines BL and BLB and reveals the data stored in nodes ND and NDB.

For illustration, node ND stores a low logical value, and node NDB stores a high logical value. Because bit line BLB is logically high, node NDB via the then turned-on transistor N4 remains at the high logical value. Because node NDB is at a gate of NMOS transistor N1 and has a high logical value, NMOS transistor N1 is turned on. Because both transistors N3 and N1 are turned on, bit line BL is pulled towards reference voltage VSS or ground at the source of NMOS transistor N1. As bit line BLB stays at the same high logical value and bit line BL is pulled towards a low logical value, a bit line split between bit lines BL and BLB develops. When the bit line split is sufficiently large, the sense amplifier is turned on to sense the bit line split and recognizes bit line BL being pulled towards a low logical value. In other words, the sense amplifier recognizes that node ND stores a low logical value and node NDB therefore stores a high logical value.

When node ND stores a high logical value, node NDB stores a low logical value. Sensing node ND storing a high logical value is similar to sensing node NDB storing a low logical value. Operations to sense node NDB having a low logical value with reference to NMOS transistors N4, N2 and bit line BLB are similar to operations to sense node ND having a low logical value with reference to NMOS transistors N3, N1 and bit line BL as explained above.

Figure 2:
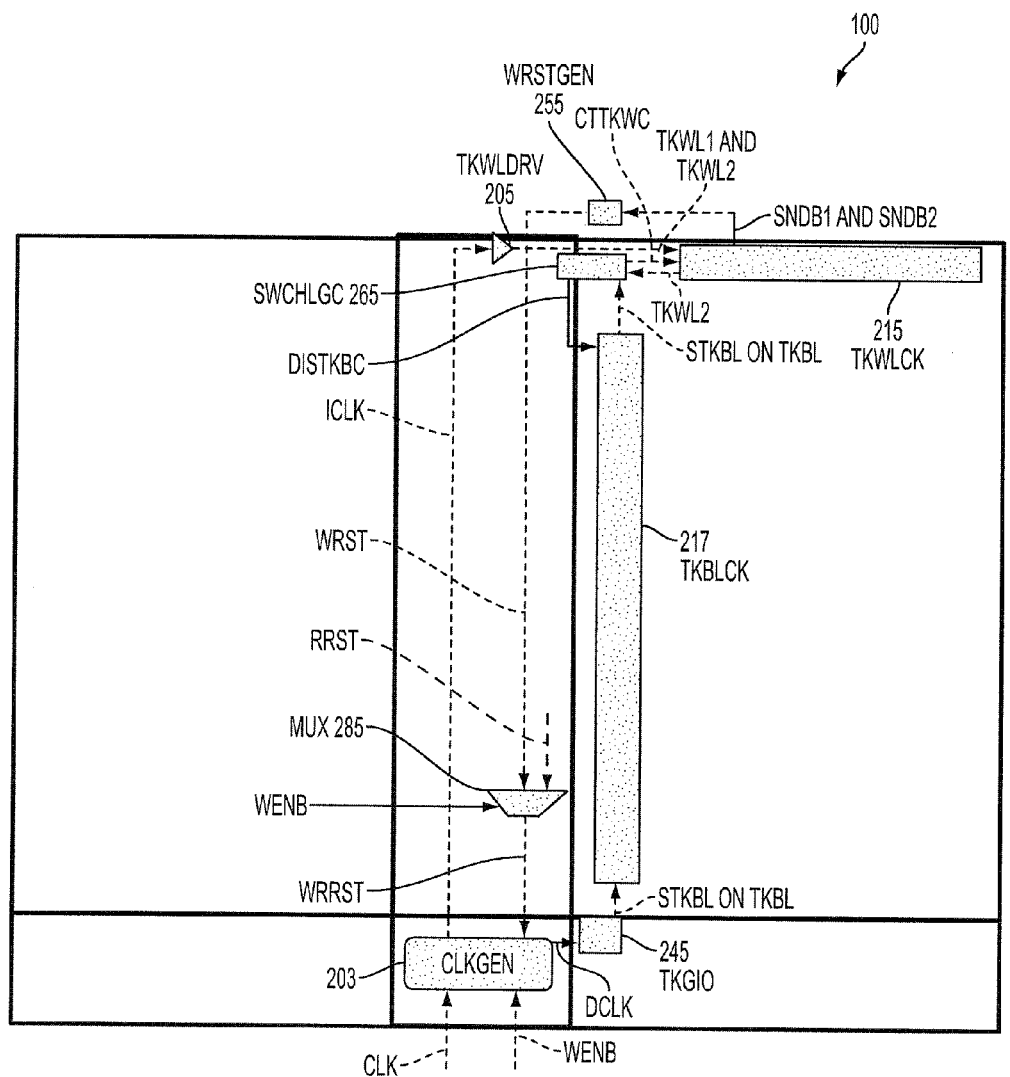
FIG. 2 is a diagram of the memory macro in FIG. 1A, having a write tracking path, in accordance with some embodiments.

Tracking write cell 200B is used in tracking word line circuit TKWLCK 215 shown in FIG. 2. Compared with memory cell 200A, a drain of NMOS transistor N4 receives a high voltage value, such as supply voltage VDD. Further, tracking word line TKWLW in tracking write cell 200B corresponds to word line WL of memory cell 200A. A drain of NMOS transistor N3 is configured to receive signal CTTKWC in FIG. 2. As a result, when tracking word line TKWLW is logically high, transistors N3 and N4 are turned on. When signal CTTKWC is logically low, the low logical value of signal CTTKWC is passed to node ND while a high logical value is passed to node NDB.

Tracking read cell 200C is used in tracking bit line circuit TKBLCK 217 shown in FIG. 2. Compared with memory cell 200A, tracking word line TKWLR corresponds to word line WL in memory cell 200A with the exceptions that tracking word line TKWLR is coupled with a gate of NMOS transistor N4, but not with a gate of NMOS transistor N3. In some embodiments, tracking word line TKWLR is the same as word line WL of a row or memory cells 200A. In other words, the gate of transistor N4 of cell 200C is coupled with tracking word line WL of memory cells 200A on the same row with cell 200C. A gate of NMOS transistor N3 receives a control signal DISTKBC, however. A drain of NMOS transistor N3 is coupled with tracking bit line TKBL to receive signal STKBL on tracking bit line TKBL. When signal DISTKBC is logically low, transistor N3 is turned off, and tracking bit cell TKBC 200C is electrically disconnected from tracking bit line TKBL. But when signal DISTKBC is logically high, transistor N3 is turned on. As a result, the drain and the source of transistor N3 are electrically coupled together. In some embodiments, the data on node ND is then transferred as signal STKBL on tracking bit line TKBL.

When tracking word line TKWLR is logically low, transistor N4 is turned off, and tracking read cell 200 is electrically disconnected from other circuit through NMOS transistor N4. A drain of NMOS transistor N4 receives a high logical value, such as supply voltage VDD.

Tracking off cell 200D is also used in tracking bit line circuit TKBLCK 217 shown in FIG. 2. Compared with tracking read cell 200C, tracking word line TKWLRO corresponds to tracking word line TKWLR. In some embodiments, tracking word line TKWLRO is the same as word line WL of a row or memory cells 200A. In other words, the gate of transistor N4 of cell 200D is coupled with tracking word line WL of memory cells 200A on the same row with cell 200D. A drain of NMOS transistor N3 is also coupled with tracking bit line TKBL. A gate of NMOS transistor N3 receives a low voltage value, such as reference supply voltage VSS, however. As a result, tracking off cell 200D is electrically disconnected from other circuits through NMOS transistor N3. A drain of NMOS transistor N4 receives reference supply voltage VSS, and is floating in some other embodiments.

Write Tracking Path

FIG. 2 is a diagram of memory macro 100 that includes a write tracking path, in accordance with some embodiments. To avoid obscuring the drawing, various elements of memory macro 100 labeled in FIG. 1A are not labeled in FIG. 2.

The write tracking path includes a clock generator (CLKGEN) 203, a tracking word line driver (TKWDRV) 205, a tracking word line circuit (TKWLCK) 215, a switching logic (SWCHLGC) 265, a tracking bit line circuit (TKBLCK) 217, a tracking global input-output (TKGIO) 245, a write reset generator (WRSTGEN) 255, and a multiplexer (MUX) 285.

Clock generator CLKGEN 203, based on a clock signal CLK and a signal WENB, generates a clock signal ICLK and a clock signal DCLK. In some embodiments, when memory macro 100 is in a write operation, signal WENB is logically low. Further, in a write operation having signal WENB logically low, clock generator CLKGEN 203, based on a rising edge of clock signal CLK, generates a rising edge of clock signal ICLK and a rising edge of clock signal DCLK.

Tracking word line driver (TKWLDRV) 205, based on clock signal ICLK, generates a signal STKWL1 on a tracking word line TKWL1 and a signal STKWL2 on a tracking word line TKWL2 for use by tracking word line circuit (TKWLCK) 215. Details of tracking word line circuit 215 are explained with references to FIG. 3. In some embodiments, tracking word line driver 205 is a buffer passing clock signal ICLK as signal STKWL1.

Details of write reset generator (WRSTGEN) 255 are explained with reference to FIG. 4. Details of tracking bit line circuit TKBLCK 217 are explained with reference to FIG. 5.

Figure 5:
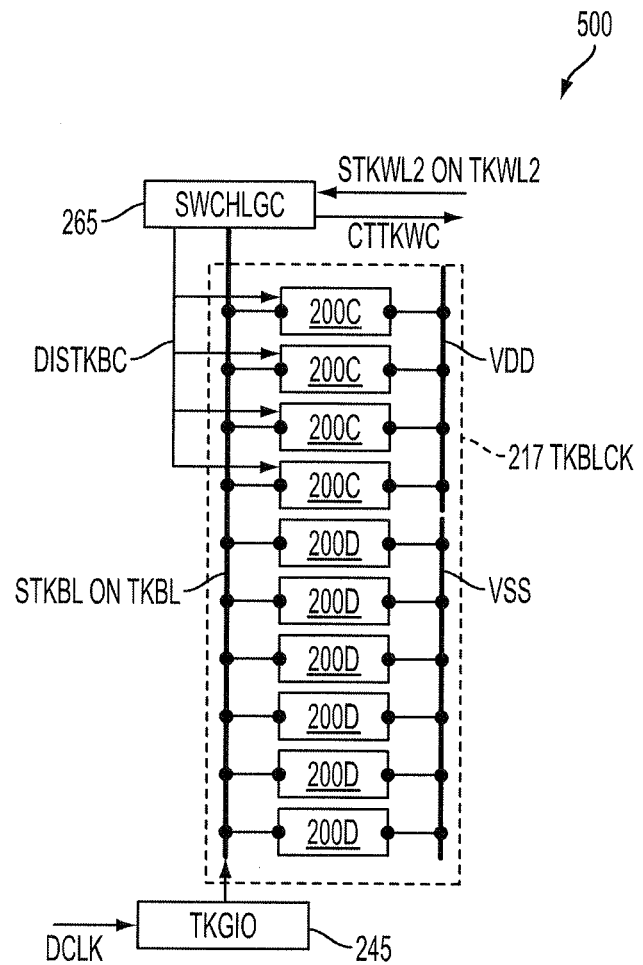
FIG. 5 is a diagram of a circuit that includes the bit line tracking circuit in the write tracking path in FIG. 2, in accordance with some embodiments.

Switching logic (SWCHLGC) 265, based on tracking word line TKWL2 generates signal DISTKBC to electrically disconnect tracking bit cells (TKBC) 200C in FIG. 5 from tracking bit line TKBL. Details of switching logic 265 are explained with reference to FIG. 6.

A selection circuit in a form of a multiplexer (MUX) 285, based on signal WENB, selects either a write reset signal WRST or a read reset signal RRST as a signal WRRST. Read reset signal RRST is provided with reference to FIG. 8. In some embodiments, when signal WENB is logically low, memory macro 100 is in a write operation, multiplexer 285 selects signal WRST as signal WRRST. Explained in another way, in a write operation, signal WRRST is signal WRST. In contrast, when signal WENB is logically high, memory macro 100 is in a read operation, multiplexer 285 selects signal RRST as signal WRRST. Effectively, in a read operation, signal WRRST is signal RRST.

In some embodiments related to a write operation, clock generator 203, based on a rising edge of signal WRRST, generates a falling edge of clock signal ICLK. Further, clock generator 203 generates a falling edge of clock signal DCLK based on a later of a falling edge of clock signal CLK or a rising edge of signal WRRST in a write operation. Effectively, clock generator 203 generates the falling edge of clock signal DCLK based on the later of the falling of clock signal CLK or the rising edge of write reset signal WRST.

Tracking Word Line Circuit, Switching Logic, Write Reset Generator

Figure 3:
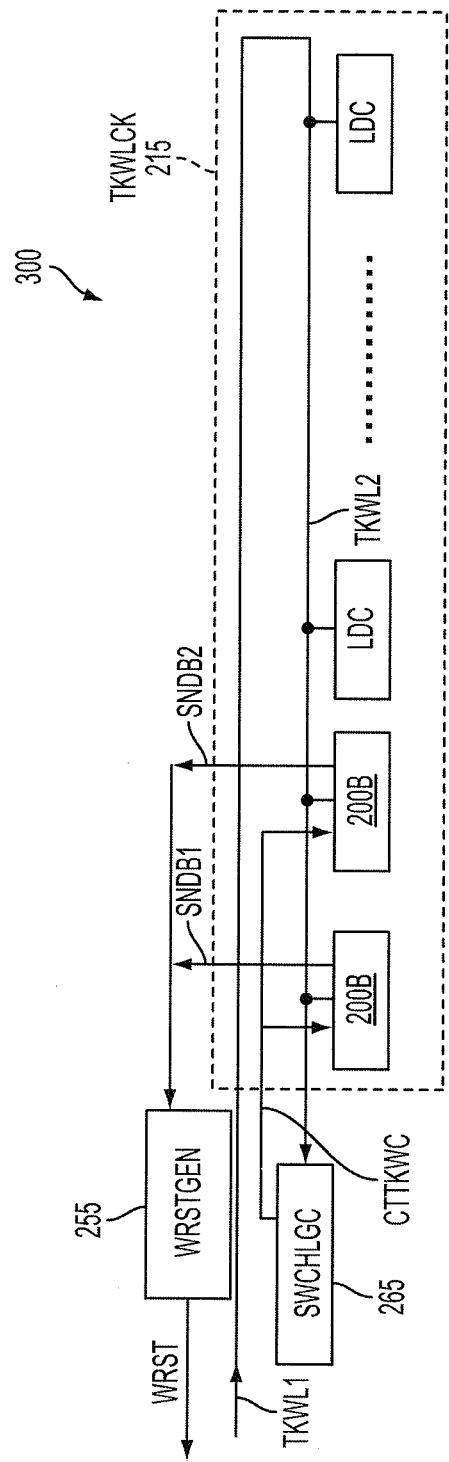
FIG. 3 is a diagram of a circuit that includes the word line tracking circuit in the write tracking path in FIG. 2, in accordance with some embodiments.

FIG. 3 is a diagram of a circuit 300, in accordance with some embodiments. Circuit 300 includes tracking word line circuit 215 coupled with write reset generator (WRSTGEN) 215 and switching logic (SWCHLGC) 265 in the write tracking path of FIG. 2.

Tracking word line circuit 215 includes a tracking word line TKWL1, a tracking word line TKWL2, two cells 200B in FIG. 1B, and a plurality of load cells LDC. In some embodiments, a memory cell 200A is used as a load cell.

Each of tracking word line TKWL1 and tracking word line TKWL2 corresponds to tracking word line TKWLW of cell 200B in FIG. 1B. Effectively, each of tracking word line TKWL1 and tracking word line TKW2 corresponds to a word line of a memory array 138 of memory macro 100.

Tracking word line TKWL1 is not coupled with any cell, and is coupled with tracking word line TKWL2. Because tracking word line TKWL1 is coupled with tracking word line TKWL2, the reference name TKWL1 or TKWL2 is used interchangeably. Further, signal STKWL1 on tracking word line TKWL1 is the same as signal STKWL2 on tracking word line TKWL2.

Tracking word line TKWL2 is coupled with two cells 200B and the plurality of load cells LDC. The total number of cells 200B plus load cells LDC equals the total number of memory cells 200A in a row of memory array 138. Effectively, tracking word line TWL2, cells 200B and load cells LDC correspond to a row of memory cells 200A coupled with a word line WL in a row of array 138 in FIG. 1A.

Two cells 200B in tracking word line circuit 215 are used for illustration. A different number of cells 200B and a different number of load cells LDC such that the total number of cells 200B and LDC being equal to the number of memory cells in an array row is within the contemplated scope of the present disclosure. The number of cells 200B in tracking word line circuit 215 is selected based on the number of memory cells 200A in array 138 so that write signals generated based on the write tracking path in FIG. 1A cover the worst case time delays and behavior of memory cells 200A in a write operation. After the number of cells 200B is determined, the number of cells LDC is determined.

Tracking word line TKWL1 coupling with none of the cells while tracking word line TKWL2 coupling with two cells 200B and load cells LDC are for illustration. Different ways for the total number of cells 200B and load cells LDC distributed in tracking word line TKWL1 and tracking word line TKWL2 are within the contemplated scope of the disclosure. For example, each of tracking word line TKWL1 or tracking word line TKWL2 is coupled with half of the total number of cells 200B and cells LDC that correspond to a number of memory cells 200A in a row of memory array 138.

Operations of tracking word line circuit 215 in conjunction with write reset generator 255 and switching logic 265 are explained with reference to FIG. 4A.

Figure 4A:
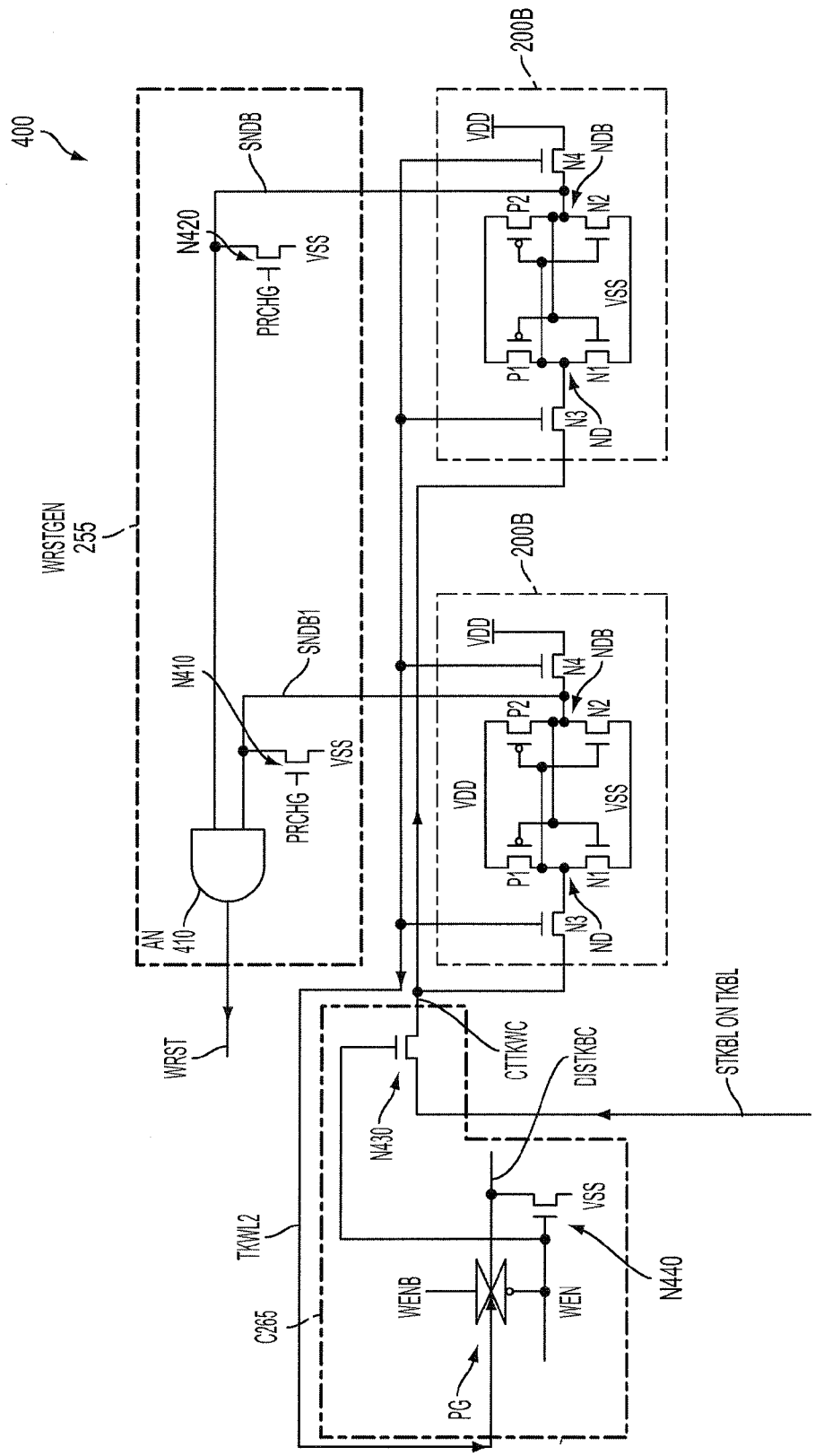
FIG. 4A is a detailed diagram of some circuits in the circuit of FIG. 3, in accordance with some embodiments.

FIG. 4A is a diagram of a circuit 400, in accordance with some embodiments. Circuit 400 includes details of switching logic 265, of write reset generator 255, and of two cells 200B.

Tracking word line TKWL2 is coupled with gates of transistors N3 and of transistors N4 of cells 200B. Tracking word line TKWL2 is also coupled with an input of a pass gate PG of switching logic 265. Signal WEN is a logical inverse of signal WNEB. In a write operation, signal WENB is logically low and signal WEN is logically high. As a result, pass gate PG is turned off and is electrically disconnected from transistor N440. Tracking word line TKWL2 therefore has no electrical effect on switching logic 265. For simplicity, connections of load cells LDC to tracking word line TKWL2 are not shown.

In some embodiments, in a write operation, switching logic 265 passes signal STKBL on tracking bit line TKBL at a drain of a transistor N430 of switching logic 265 as a signal CTTKWC at a source of transistor N430. For example, because signal WEN is at a gate of NMOS transistor N430, NMOS transistor N430 is turned on. As a result, signal STKBL at a drain of transistor N430 is passed to a source of transistor N430, and is called signal CTTKWC. In such a condition, signal STKBL in the form of signal CTTKWC is fed to the drain of each transistor N3 of each cell 200B. Further, because signal TKWL2 is logically high, transistor N3 of each cell 200B is turned on, and each node ND of each cell 200B has a logical value from signal CTTKWC at the drain of each transistor N3. In a write operation, signal STKBL transitions from a high to a low logical value as explained below. As a result, signal CTTKWC also transitions to a low logical value of signal STKBL. Effectively, each node ND of each cell 200B has a low logical value of signal STKBL.

Because signal STKWL2 at a gate of each NMOS transistor N4 of each cell 200B is logically high, transistor N4 of each cell 200B is turned on. Even though the drain of each transistor N4 is at supply voltage VDD, by operations of cell 200B, node NDB of each cell 200B continues to be at a low logical value until signal CTTKWC at the drain of transistor N3 is logically low. In other words, node NDB of each cell 200B transitions to a high logical value when signal CTTKWC transitions from a high to a low logical value.

Write reset generator 255 includes a logic gate in a form of an AND gate AN410. Each input of AND gate AN410 is coupled with an NMOS transistor and node NDB of a corresponding cell 200B. For example, a first input of AND gate AN410 is coupled with a transistor N410 and node NDB of a first cell 200B. A second input of AND gate AN410 is coupled with a transistor N420 and node NDB of a second cell 200B. An output of AND gate AN410 carries write reset signal WRST. AND gate AN410 having two inputs is for illustration. The number of inputs of AND gate AN410 corresponds to the number of cells 200B of tracking word line circuit 215 in FIG. 3. For example, if tracking word line circuit 215 includes a predetermined N number of cells 200B, wherein N is an integer number, then AND gate AN410 includes N corresponding inputs.

Node NDB of the first cell 200B is coupled with a first input of AND gate AN410 and with a first NMOS transistor N410. In some embodiments, in a pre-charge mode, transistor N410 is turned on by a signal PRECHG to pull signal SNDB1 to a low logical value at a source of transistor N410. Transistor N410 is then turned off to be electrically disconnected from AND gate AN410. Similarly, node NDB of the second cell 200B is coupled with a second input of AND gate AN410 and with a second NMOS transistor N420. In some embodiments, in the pre-charge mode, transistor N420 is turned on by signal PRECHG to pull signal SNDB2 to a low logical value at a source of transistor N420. Transistor N420 is then turned off to be electrically disconnected from AND gate AN410. Signal PRECHG is a logical inverse of a signal PRECHGB in FIG. 6.

When both signals SNDB1 and SNDB2 at inputs of AND gate AN410 are logically high, such as when signal CTTKWC transitions to a low logical value as explained above, signal WRST at the output of AND gate AN410 is logically high. Effectively, when signal STKBL transitions from a high to a low logical value, signal WRST transitions from a low to a high logical value.

Figure 4B:
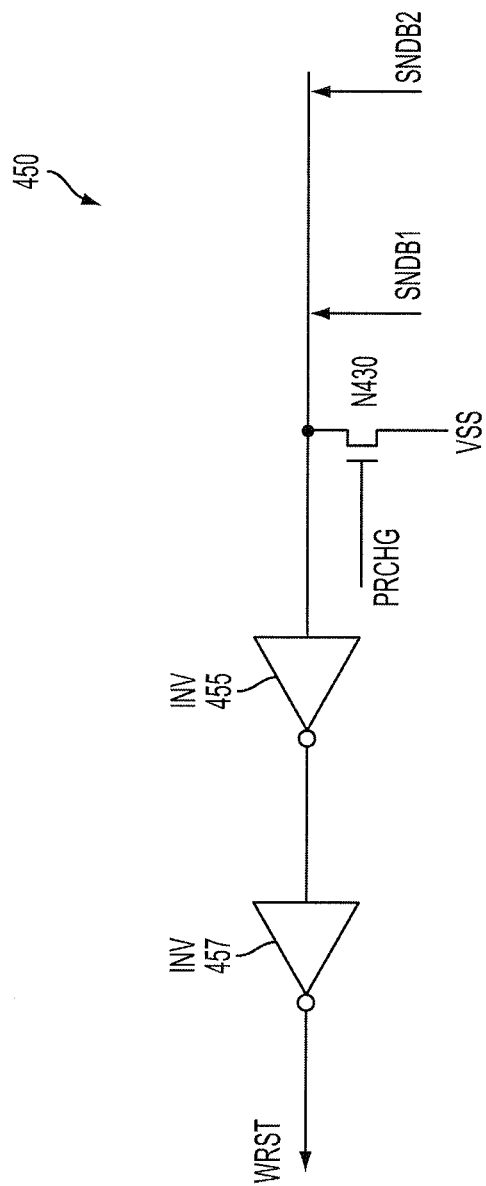
FIG. 4B is a diagram of another implementation of the write reset generator circuit in FIG. 4A, in accordance with some embodiments.

FIG. 4B is a diagram of a circuit 450, in accordance with some embodiments. Circuit 450 is another implementation of write reset generator 255. Circuit 450 includes a pair of logic gates in a form of inverters INV455 and INV457, and an NMOS transistor N430. An input of inverter INV455 is coupled with and receives a signal from nodes NDB of cells 200B of FIG. 4A. For example, an input of inverter INV455 receives signals SNDB1 and SNDB2 of nodes NDB of two cells 200B in FIG. 4A. By operations of inverters INV455 and INV457, when nodes NDB of cells 200B in FIG. 4A transition to from a low to a high logical value, write reset signal WRST at an output of inverter INV457 also transitions from a low to a high logical value.

NMOS transistor N430 is turned on and off based on signal PRCHG at a gate of transistor N430. One transistor N430 is shown for illustration, a different number of transistors N430 is within the contemplated scope of the present disclosure. A size of transistor N430 is selected sufficiently to pull signals SNDB1 and SNDB2 to a low logical value. For example, in a pre-charge mode, signal PRCHGB is logically low and signal PRCHG is logically high. As a result, transistor N430 is turned on, and has a size sufficient to pull signals SNDB1 and SNDB2 to supply reference voltage VSS at a source of transistor N430.

Implementations of write reset generator 255 in FIGS. 4A and 4B are used for illustration. Other circuits generating write reset signal WRST transitioning from a low to a high logical value when nodes NDB of cells 200B transitioning from a low to a high logical value are within the contemplated scope of the present disclosure. For example, the pair of inverters INV455 and INV457 may be replaced by a buffer and or other logic gates. Similarly, AND gate N410 in FIG. 4A may be replaced by another logic gate.

FIG. 5 is a diagram of a circuit 500, in accordance with some embodiments. Circuit 500 includes tracking bit line circuit 217 coupled with switching logic 265 and tracking GIO 245.

Tracking bit line circuit 217 includes four tracking bit cells (TKBC) 200C, and a plurality of tracking off cells (TKOC) 200D. Each of a tracking bit cell TKBC 200C receives a same signal DISTKBC from switching logic 265, and is turned on and off by signal DISTKBC. Details of operations of signal DISTKBC with reference to tracking bit cells 200C are explained with reference to FIG. 6.

In some embodiments, the total number of tracking bit cells 200C and of off cells 200D coupled to tracking bit line TKBL equals the total number of memory cells 200A coupled with a bit line BL or a bit line BLB of a column of array 138 in memory macro 100 in FIG. 1A. Effectively, a tracking bit line TKBL coupled with tracking bit cells 200C and tracking off cells 200D corresponds to a bit line BL or a bit line BLB coupled with memory cells 200A in a column of memory array 138 of memory macro 100. Details of connections of tracking bit line TKBL to cells 200C and 200D are explained with reference to FIG. 6. In some embodiments, after a number of tracking bit cells 200C for tracking bit line circuit 500 is selected, a number of tracking off cells 200D is selected. Four cells 200C are used for illustration. A different number of cells 200C is within the contemplated scope of the present disclosure. The number of cells 200C in tracking bit line circuit 217 is selected based on the number of memory cells 200A in memory macro 100 in FIG. 1A.

Details and operations of tracking input-output (TKGIO) 245 are explained with reference to FIG. 6.

Figure 6:
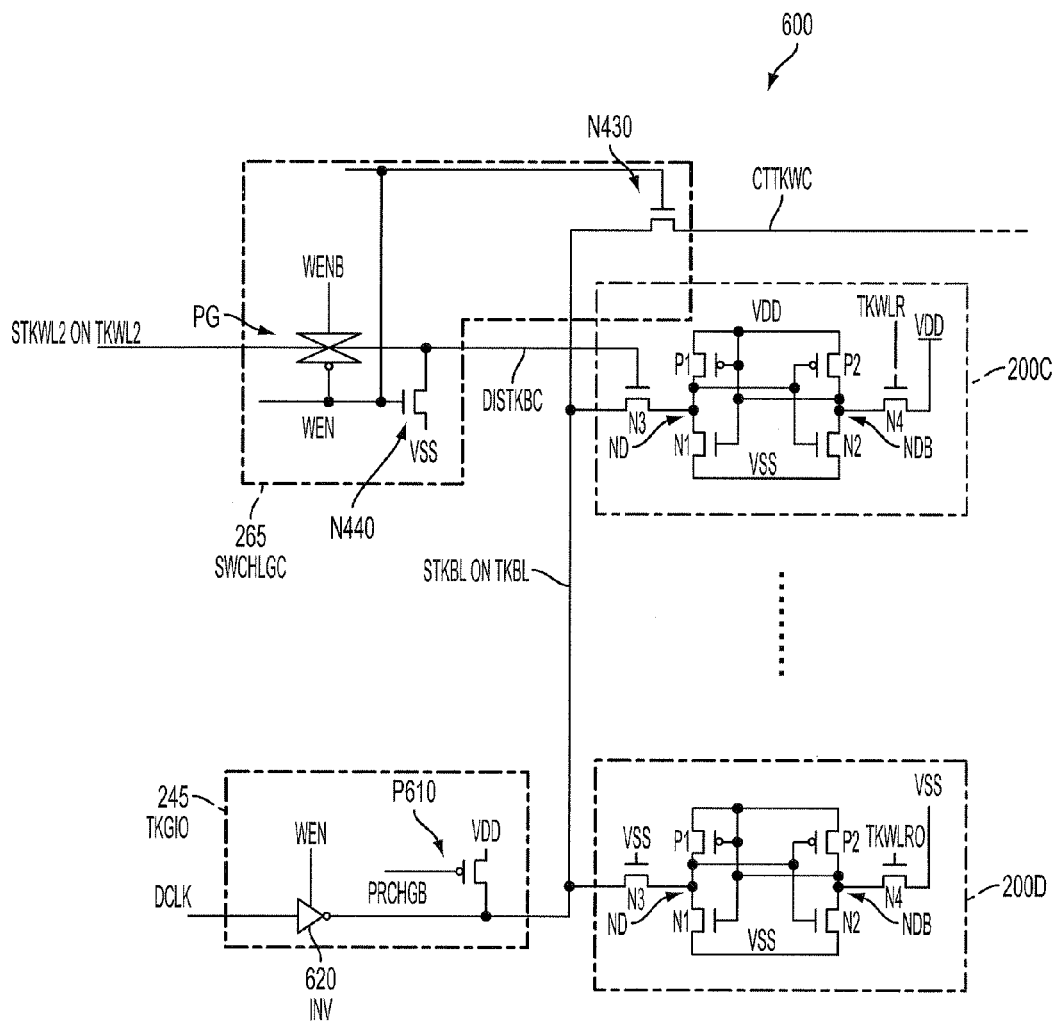
FIG. 6 is a detailed diagram of some circuits in the circuit of FIG. 5, in accordance with some embodiments.

FIG. 6 is a diagram of a circuit 600, in accordance with some embodiments. Circuit 600 includes details of switching logic (SWCHLGC) 265, of tracking global input-output (TKGIO) 245, of a cell 200C, and of a cell 200D. Connections and operations of other cells 200C in tracking bit line circuit 217 are similar to those of cell 200C in FIG. 6. Similarly, connections and operations of other cells 200D in tracking bit line circuit 217 are similar to those of cell 200D in FIG. 6.

With reference to switching logic 265, in a write operation, signal WEN is logically high and signal WENB is logically low, and pass gate PG is turned off as explained above with reference to FIG. 4. Because signal WEN at the gate of transistor N440 is logically high, transistor N440 is turned on. As a result, signal DISTKBC at the drain of transistor N440 is pulled to a low logical value or reference voltage VSS at a source of transistor N440. Signal DISTKBC is also at a gate of transistor N3 of cell 200C. Consequently, transistor N3 of cell 200C is turned off, and cell 200C is electrically disconnected from tracking bit line TKBL.

The gate of transistor N3 of cell 200D receives supply reference voltage VSS. As a result, transistor N3 is turned off, and cell 200D is also electrically disconnected from tracking bit line TKBL.

With reference to TKGIO 245, in some embodiments, in a pre-charge mode PMOS transistor P610 is turned on by signal PRECHGB at a gate of transistor P610. As a result, tracking bit line TKBL is pre-charged and pulled to a high logical value of supply voltage VDD at a source of PMOS transistor P610. After the pre-charge mode, transistor P610 is turned off, and is electrically disconnected from tracking bit line TKBL.

Because signal WEN is logically high, inverter INV620 is turned on. When signal DLCK is logically high, by operation of inverter INV620, tracking bit line TKBL coupled with an output of inverter INV620 is logically low. Effectively, signal STKBL on tracking bit line TKBL transitions from a high to a low logical value. In parallel, transistor N430 in switching logic 265 is turned on, and the low logical value of signal STKBL on tracking bit line TKBL coupled with the drain of transistor N430 is passed to the source of transistor N430 as signal CTTKWC.

Write Operation Waveforms

Figure 7:
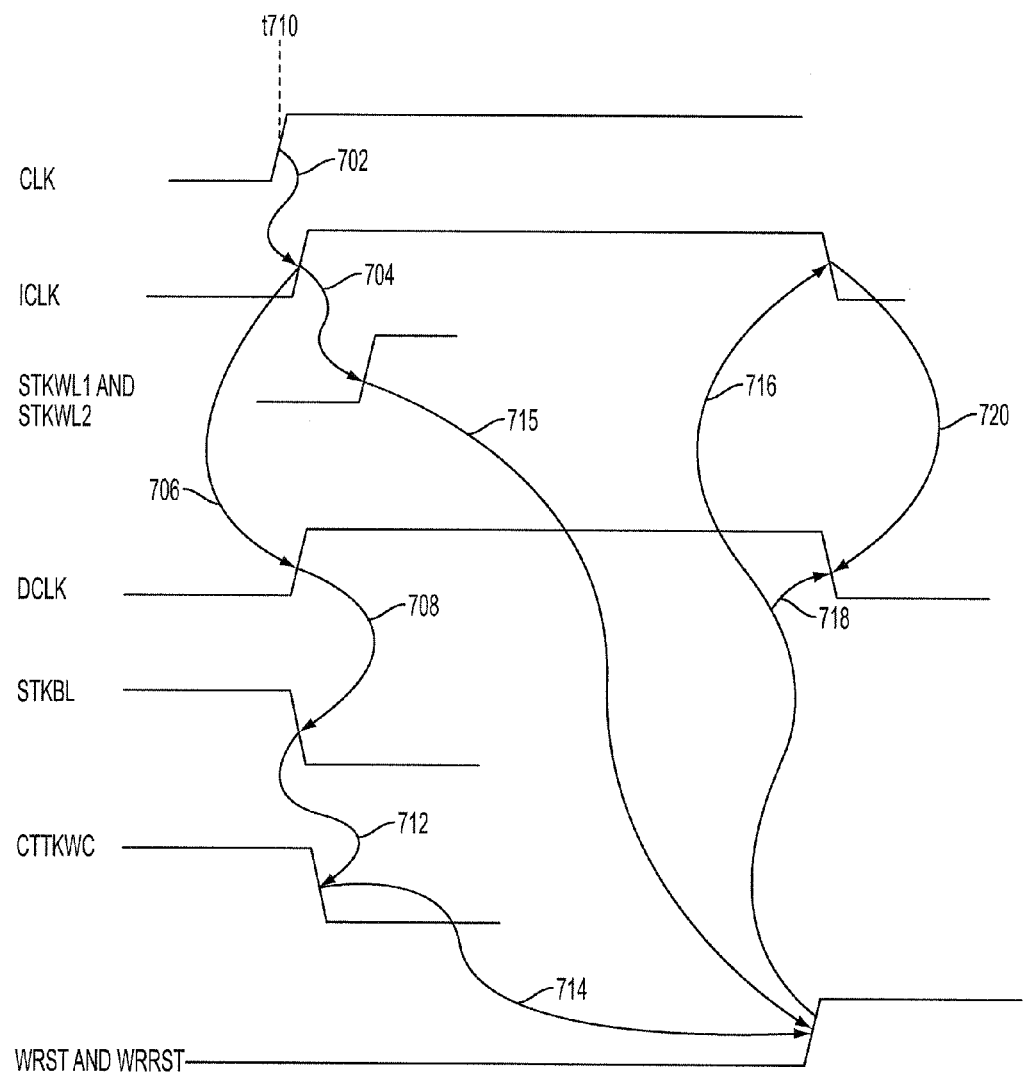
FIG. 7 is a graph of waveforms of various signals related to a write operation, in accordance with some embodiments.

FIG. 7 is a graph of waveforms of various signals, in accordance with some embodiments. Waveforms in FIG. 7 are used to illustrate a write operation in the writing tracking path in FIG. 2. In this illustration, because memory macro 100 in FIG. 1 is in a write operation, signal WENB is logically low and signal WEN is logically high. Further, details of how each falling edge or rising edge of a corresponding signal is created can be referred to corresponding explanations with reference to FIGS. 1 to 6 above.

At a time t710, clock signal CLK received by memory macro 100 in FIG. 1A transitions from a low to a high logical value. Clock generator 203, based on a rising edge of clock signal CLK, generates a rising edge of clock signal ICLK, as indicated by arrow 702. Tracking word line driver 205, based on the rising edge of clock signal ICLK, generates a rising edge of signal STKWL1 on tracking word line TKWL1, as indicated by arrow 704. As explained above, signal STKWL1 on tracking word line TKWL1 is the same as signal STKWL2 on tracking word line TKWL2.

Clock generator 203, based on a rising edge of clock signal CLK, also generates a rising edge of clock signal DCLK, as indicated by arrow 706.

Because signal WEN is logically high, inverter INV620 of TKGIO 245 in FIG. 6 is turned on, and an inverse of clock signal DCLK is seen at tracking bit line TKBL. Effectively, signal STKBL on tracking bit line TKBL transitions to a low logical value as indicated by arrow 708.

Because signal WEN at the gate of transistor N430 in FIG. 4A is logically high, transistor N430 is turned on, and signal STKBL on tracking bit line TKBL is passed through transistor N430 as signal CTTKWC. Because signal TKWL2 is logically high, transistors N3 of cells 200B in FIG. 4A are on. As a result, signal CTTKWC transitions to a low logical value, as indicated by arrow 712. Consequently, signals SNDB1 and SNDB2 in FIG. 4A transition to a high logical value. By operation of AND gate AN410, signal WRST is logically high. In a write operation, by operation of multiplexer 285 in FIG. 1, signal WRRST is signal WRST. Effectively, signal WRST and signal WRRST transition to a high logical value, as indicated by arrow 714. Because signal STKWL2 turns on transistor N3 that causes a sequence of node ND being logically low, node NDB being logically high, and signal WRST being logically high, effectively, signal WRST transitions to a high logical value based on signal STKWL2, as indicated by arrow 715.

In FIG. 1, clock generator 203, based on a rising edge of signal WRRST, generates a falling edge of clock signal ICLK as indicated by arrow 716. Clock generator 203 also generates a falling edge of clock signal DCLK based on a rising edge of signal WRRST as indicated by arrow 718 or based on a falling edge of clock signal CLK as indicated by arrow 720.

Read Tracking Path

Figure 8:
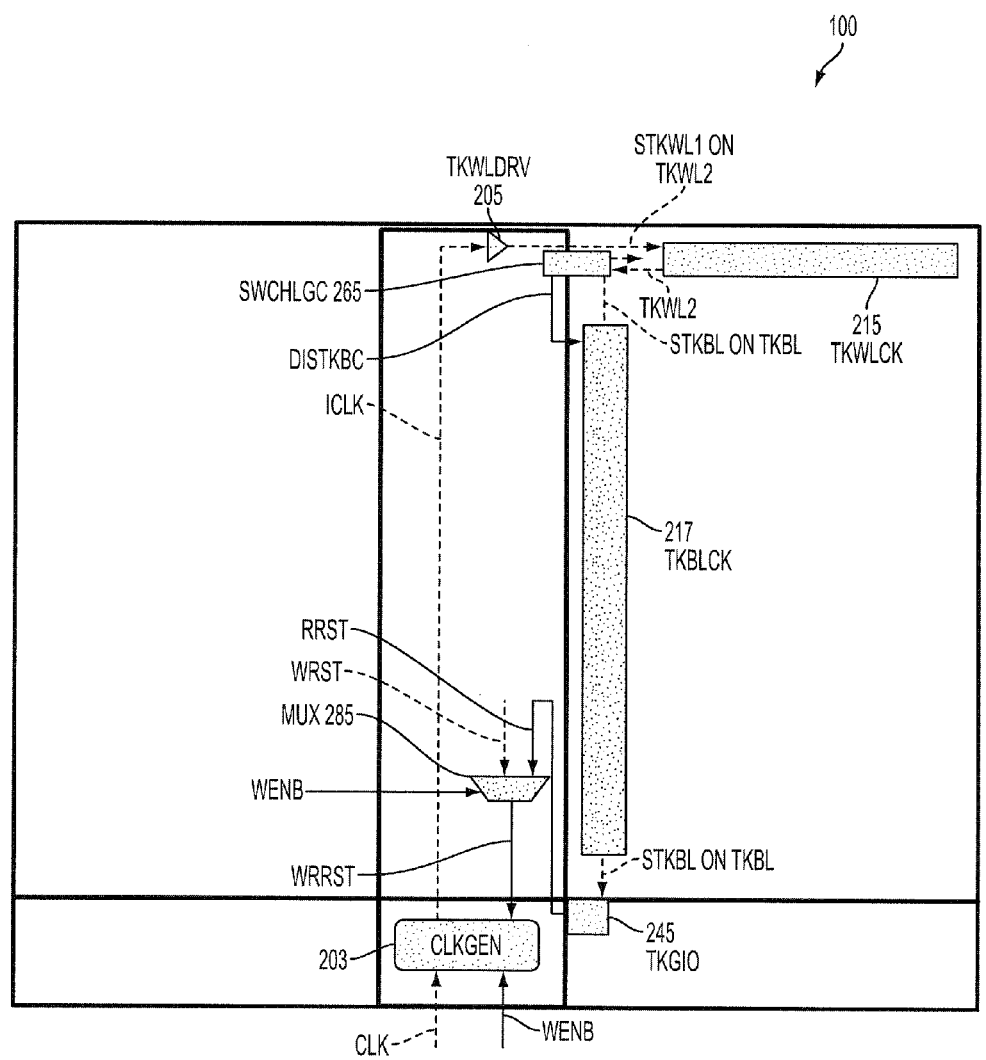
FIG. 8 is a diagram of the memory macro in FIG. 1A, having a read tracking path, in accordance with some embodiments.

FIG. 8 is a diagram of memory macro 100 having a read tracking path, in accordance with some embodiments. To avoid obscuring the drawing, various elements of memory macro 100 labeled in FIG. 1A are not labeled in FIG. 8.

The read tracking path includes clock generator (CLK-GEN) 203, tracking word line driver (TKWDRV) 205, tracking word line circuit (TKWLCK) 215, switching logic (SWCHLGC) 265, tracking bit line circuit (TKBLCK) 217, tracking global input-output (TKGIO) 245, and multiplexer (MUX) 285.

Clock generator 203, based on clock signal CLK and signal WENB, generates clock signal ICLK. In some embodiments, when memory macro 100 is in a read operation, signal WENB is logically high. Clock generator 203 generates clock signal ICLK in a read operation in a manner similar to clock generator 203 generating clock signal ICLK in a write operation as explained above with reference to FIG. 2. For example, clock generator 203 generates a rising edge of clock signal ICLK based on a rising edge of clock signal CLK.

Tracking word line driver (TKWLDRV) 205, based on clock signal ICLK, generates signal STKWL1 on tracking word line TKWL1 and signal STKWL2 on tracking word line TKWL2 for use by tracking word line circuit (TKWLCK) 215. Tracking word line driver 205 generates signal STKWL1 in a read operation in a manner similar to tracking word line driver 205 generating signal STKWL1 in a write operation as explained above with reference to FIG. 2. For example, tracking word line driver 205 generates a rising edge of signal STKWL1 based on a rising edge of clock signal ICLK.

Details of tracking word line driver circuit 215 in a read operation are explained with reference to FIG. 9.

Details of tracking bit line circuit TKBLCK 217 in a read operation are explained with reference to FIG. 10.

Details of switching logic 265 and of TKGIO 245 in a read operation are explained with reference to FIG. 11.

Multiplexer (MUX) 285, based on signal WENB, selects either write reset signal WRST or read reset signal RRST as signal WRRST. Write reset signal WRST is provided with reference to FIG. 2. In some embodiments, when memory macro 100 is in a read operation, signal WENB is logically high, multiplexer 285 selects signal RRST as signal WRRST. Explained in another way, in a read operation, signal WRRST is signal RRST.

In some embodiments related to a read operation, clock generator 203, based on a rising edge of signal WRRST, generates a falling edge of clock signal ICLK. Tracking word line driver 205, based on the falling edge of clock signal ICLK, generates a falling edge of signal STKWL1 on tracking word line TKWL1.

Figure 9:
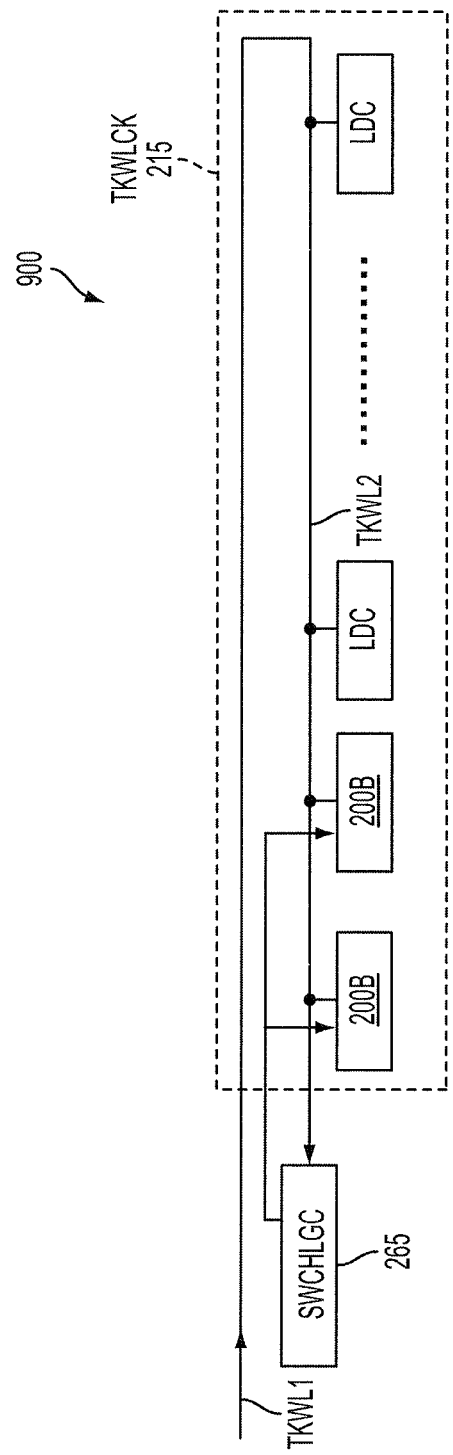
FIG. 9 is a diagram of a circuit that includes the tracking word line circuit in the read tracking path of FIG. 8, in accordance with some embodiments.

FIG. 9 is a diagram of a circuit 900, in accordance with some embodiments. Circuit 900 is used in the read path of FIG. 8. Compared with circuit 300, circuit 900 includes tracking word line circuit 215 and switching logic 265, but does not include write reset generator 255. Effectively, in a read operation, tracking word line circuit 215 and switching logic 265 are used, but write reset generator 255 is not used.

Figure 10:
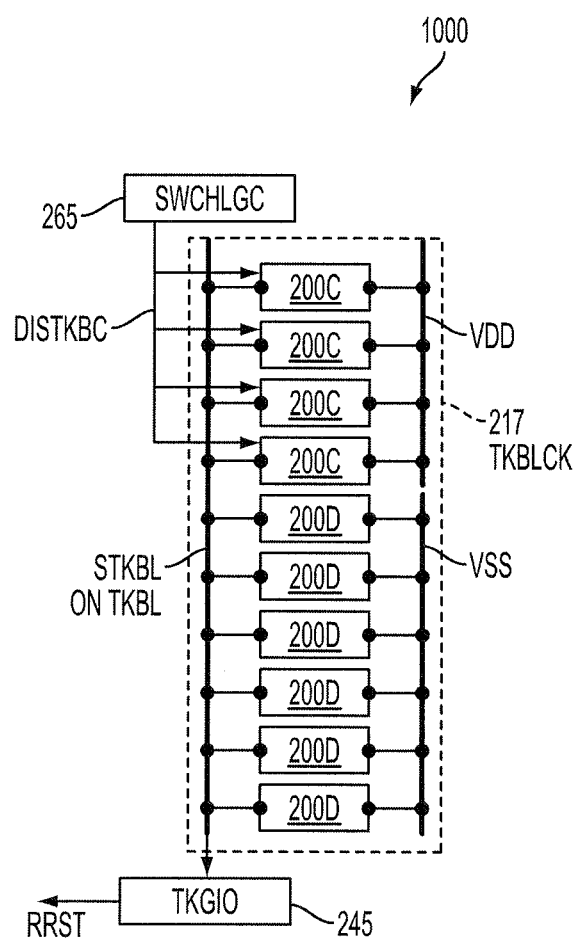
FIG. 10 is a diagram of a circuit that includes the tracking bit line circuit in the read tracking path of FIG. 8, in accordance with some embodiments.

FIG. 10 is a diagram of a circuit 1000, in accordance with some embodiments. Circuit 1000 is used in the tracking path of FIG. 8. Compared with circuit 500, circuit 1000 includes the same switching logic 265, tracking bit line circuit 217, and tracking global input-output 245. In circuit 1000, however, tracking global input-output 245 receives signal STKBL on tracking bit line TKBL as an input and generates signal RRST as an output.

Figure 11:
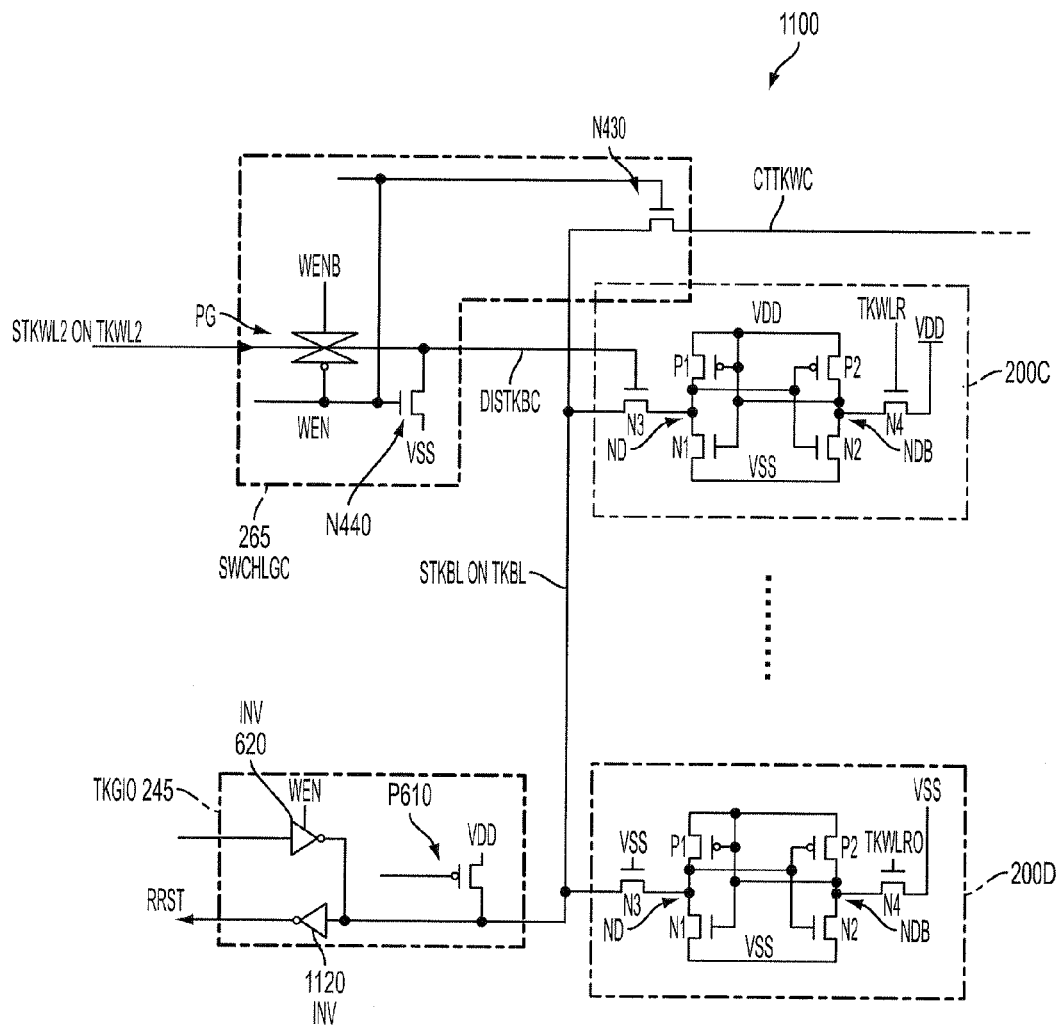
FIG. 11 is a detailed diagram of some circuits in the circuit of FIG. 10, in accordance with some embodiments.

FIG. 11 is a diagram of a circuit 1100, in accordance with some embodiments. Circuit 1100 includes details of switching logic 265, of tracking input-output 245, of a cell 200C, and of a cell 200D, which are explained in the context of a read path. Because circuit 1100 is in a read path, signal WEN is logically low and signal WENB is logically high.

With reference to switching logic 265, because signal WEN at gates of NMOS transistors N430 and N440 is logically low, transistors N430 and N440 are turned off. As a result, transistor N430 is electrically disconnected from bit line TKBL, and transistor N440 is electrically disconnected from pass gate PG and from cell 200C.

Further, because signal WEN is logically low and signal WENB is logically high, pass gate PG is turned on. Signal STKWL2 generated in FIG. 9 is therefore passed to the gate of transistor N3 of cell 200C. As a result, transistor N3 is turned on, and tracking bit line TKBL at the drain of transistor N3 is electrically coupled with node ND at the source of transistor N3.

With reference to TKGIO 245, in a read operation, signal WEN is logically low and inverter INV620 is turned off and therefore electrically disconnected from tracking bit line TKBL. In some embodiments, in a pre-charge mode, PMOS transistor P610 is turned on to pre-charge tracking bit line TKBL to a high logical value at the source of transistor P610. Transistor P610 is then turned off, and has no electrical effect on tracking bit line TKBL.

With reference to cell 200C, because NMOS transistor N3 and NMOS transistor N1 are turned on, node ND and signal STKBL are pulled to a low logical value at the source of transistor N1. In other words, signal STKBL transitions from a high logical value of the pre-charge condition to a low logical value caused by transistors N3 and N1.

By operations of inverter INV1120 of TKGIO 245, the transition of signal STKBL from a high to a low logical value causes signal RRST at an output of inverter INV620 to transition from a low to a high logical value.

Read Operation Waveforms

Figure 12:
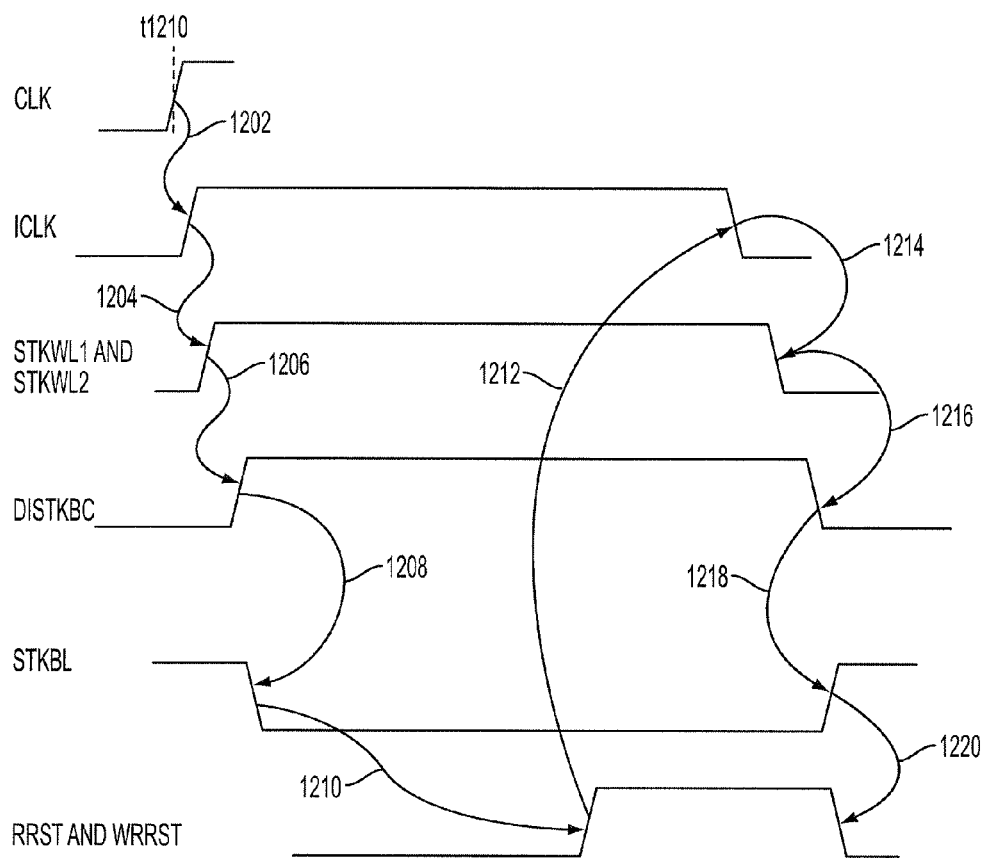
FIG. 12 is a graph of waveforms of various signals related to a reading operation, in accordance with some embodiments.

FIG. 12 is a graph of waveforms of various signals, in accordance with some embodiments. Waveforms in FIG. 12 are used to illustrate a read operation in the read tracking path in FIG. 8. In this illustration, because memory macro 100 in FIG. 1A is in a read operation, signal WENB is logically high and signal WEN is logically low. Further, details of how each rising edge or falling edge of a corresponding signal is created can be referred to corresponding explanations with reference to FIGS. 8 to 11 above.

At a time t1210, clock signal CLK transitions to a high logical value. Clock generator 203 in FIG. 8 generates a rising edge of clock signal ICLK as indicated by arrow 1202. Tracking word line driver 205, based on the rising edge of clock signal ICLK, generates a rising edge of signals STKWL1 and STKWL2 on respective tracking word lines TKWL1 and TKWL2, as indicated by arrow 1204. In FIG. 9, signals STKWL1 and STKWL2 propagate through tracking word line circuit 215 and reach switching logic 265.

In FIG. 11, transistor P610 of TKGIO 245 is turned on to pre-charge tracking bit line TKBL. Transistor P610 is then turned off. Effectively, signal STKBL on tracking bit line TKBL is floating with a high logical value. Further, when signal WEN is logically high, transistor N440 of switching logic 265 is on, and pulls signal DISTKBC to a low logical value at the source of transistor N440. When signal WEN is logically low in a read operation, transistor N440 is turned off, and signal DISTKBL is floating with a low logical value.

Effectively, in a read operation, transistor N430 is off, transistor N440 is off, and pass gate PG is on. Because pass gate PG is on, the high logical value of signal STKWL2 is transferred as signal DISTKBC to the gate of transistor N3 of cell 200C. In other words, signal DISTKBC transitions from a low to a high logical value, as indicated by arrow 1206. Because signal DISTKBC is logically high, transistor N3 of cell 200C is turned on, and signal STKBL on tracking bit line TKBL is pulled from a high to a low logical value of node ND at the source of transistor N3, as indicated by arrow 1208.

By operations of inverter INV620, signal RRST at an output of inverter INV620 transitions from a low to a high logical value. In a read operation, signal WRRST is signal RRST. Effectively, signal RRST and WRRST transition from a low to a high logical value, as indicated by arrow 1210.

In some embodiments, based on corresponding circuits disclosed throughout this document, a rising edge of signal RRST in the form of signal WRRST is used to cause a sequence of transitions of various signals. For example, the sequence of transitions includes a falling edge of clock signal ICLK as indicated by arrow 1212, a falling edge of signal STKWL1 and signal STKWL2 as indicated by arrow 1214, a falling edge of signal DISTKBC as indicated by arrow 1216, a ring edge of signal STKBL as indicated by arrow 1218, and a falling edge of signal RRST and signal WWRST as indicated by arrow 1220.

In some embodiments, a circuit is in a memory macro and comprises a write path, a read path, a selection circuit, and a clock generator circuit. The write path includes a first signal generated based on a first edge of a clock signal in a write operation of the memory macro. The read path includes a second signal generated based on a first edge of the clock signal in a read operation of the memory macro. The selection circuit is configured to select the first signal as a third signal in the write operation of the memory macro, and to select the second signal as the third signal in the read operation of the memory macro. The clock generator circuit is configured to generate a second edge of the clock signal in the write operation or in the read operation, based on the third signal.

In some embodiments, a circuit is in a memory macro and comprises a clock generator circuit, a word line driver circuit, a word line circuit, a bit line circuit, a switching circuit, a write signal generator circuit, a data circuit, and a selection circuit. The clock generator circuit is configured to receive a first clock signal. In a write operation of the circuit, the clock generator circuit, based on the first clock signal, is configured to cause the word line driver circuit, the word line circuit, the bit line circuit, the data circuit, the switching circuit, and the write signal generator circuit to generate a first signal, and the selection circuit is configured to select the first signal for use by the clock generator circuit. In a read operation of the circuit, the clock generator circuit, based on the first clock signal, is configured to cause the word line driver circuit, the word line circuit, the bit line circuit, the switching circuit, and the data circuit to generate a second signal, and the selection circuit is configured to select the second signal for use by the clock generator circuit.

In some embodiments, a method regards a write operation and a read operation of a memory macro. In the write operation, a first signal is generated based on a first clock signal generated by a clock generator circuit, and a selection circuit selects the first signal for use by the clock generator circuit. In the read operation, a second signal different from the first signal is generated based on a second clock signal generated by the clock generator circuit, and the selection circuit selects the second signal for use by the clock generator circuit.

A number of embodiments have been described. It will nevertheless be understood that various modifications may be made without departing from the spirit and scope of the present disclosure. For example, various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. A low or high logical value of various signals used in the above description is also for illustration. Various embodiments are not limited to a particular logical value when a signal is activated or deactivated. Selecting different logical values is within the contemplated scope of the present disclosure. In various embodiments, a transistor functions as a switch. A switching circuit used in place of a transistor is within the scope of various embodiments. In various embodiments, a source of a transistor can be configured as a drain, and a drain can be configured as a source.

The above illustrations include exemplary steps, but the steps are not necessarily performed in the order shown. Steps may be added, replaced, changed order, and/or eliminated as appropriate, in accordance with the spirit and scope of disclosed embodiments.

What is claimed is:

1. A circuit in a memory macro, comprising:
a clock generator circuit configured to receive a first clock signal;
a word line driver circuit;
a word line circuit;
a bit line circuit;
a switching circuit;
a write signal generator circuit;
a data circuit; and
a selection circuit,
wherein
in a write operation of the circuit,
the clock generator circuit, based on the first clock signal, is configured to cause the word line driver circuit, the word line circuit, the bit line circuit, the data circuit, the switching circuit, and the write signal generator circuit to generate a first signal; and
the selection circuit is configured to select the first signal for use by the clock generator circuit;
in a read operation of the circuit,
the clock generator circuit, based on the first clock signal, is configured to cause the word line driver circuit, the word line circuit, the bit line circuit, the switching circuit, and the data circuit to generate a second signal; and
the selection circuit is configured to select the second signal for use by the clock generator circuit; and the clock generator circuit is further configured to cause generation of at least one of the first signal or the second signal based on the selected first signal or second signal.

2. The circuit of claim 1, wherein
the memory macro comprises a memory word line coupled with a plurality of memory cells;
the word line circuit comprises a tracking word line coupled with a plurality of load cells; and
a number of cells of the plurality of cells coupled with the tracking word line equals a number of memory cells of the plurality of memory cells coupled with the memory word line.

3. The circuit of claim 2, wherein
a memory cell of the plurality of memory cells includes a first PMOS transistor, a second PMOS transistor, a first NMOS transistor, a second NMOS transistor, a third NMOS transistor, and a fourth NMOS transistor;
a cell of the plurality of cells includes a third PMOS transistor, a fourth PMOS transistor, a fifth NMOS transistor, a sixth NMOS transistor, a seventh NMOS transistor, and an eighth NMOS transistor;
the third PMOS transistor corresponds to the first PMOS transistor;
the fourth PMOS transistor corresponds to the second PMOS transistor;
the fifth NMOS transistor corresponds to the first NMOS transistor;
the sixth NMOS transistor corresponds to the second NMOS transistor;
the seventh NMOS transistor corresponds to the third NMOS transistor; and
the eight NMOS transistor corresponds to the fourth NMOS transistor.

4. The circuit of claim 2, wherein
a memory cell of the plurality of memory cells includes a first PMOS transistor, a second PMOS transistor, a first NMOS transistor, a second NMOS transistor, a third NMOS transistor, and a fourth NMOS transistor;
the plurality of cells includes a first-type cell and a second type cell;
the first-type cell includes a third PMOS transistor, a fourth PMOS transistor, a fifth NMOS transistor, a sixth NMOS transistor, a seventh NMOS transistor, and an eighth NMOS transistor;
the third PMOS transistor corresponds to the first PMOS transistor;
the fourth PMOS transistor corresponds to the second PMOS transistor;
the fifth NMOS transistor corresponds to the first NMOS transistor;
the sixth NMOS transistor corresponds to the second NMOS transistor;
the seventh NMOS transistor corresponds to the third NMOS transistor;
the eight NMOS transistor corresponds to the fourth NMOS transistor;
the second-type cell includes a fifth PMOS transistor, a sixth PMOS transistor, a ninth NMOS transistor, a tenth NMOS transistor, an eleventh NMOS transistor, and a twelfth NMOS transistor;
the fifth PMOS transistor corresponds to the first PMOS transistor;
the sixth PMOS transistor corresponds to the second PMOS transistor;
the ninth NMOS transistor corresponds to the first NMOS transistor;

the tenth NMOS transistor corresponds to the second NMOS transistor;
the eleventh NMOS transistor corresponds to the third NMOS transistor; and
the twelfth NMOS transistor corresponds to the fourth NMOS transistor.

5. The circuit of claim 1, wherein
the memory macro comprises a memory bit line coupled with a plurality of memory cells;
the bit line circuit comprises a tracking bit line coupled with a plurality of cells; and
a number of cells of the plurality of cells coupled with the tracking bit line equals a number of memory cells of the plurality of memory cells coupled with the memory bit line.

6. The circuit of claim 5, wherein
a memory cell of the plurality of memory cells includes a first PMOS transistor, a second PMOS transistor, a first NMOS transistor, a second NMOS transistor, a third NMOS transistor, and a fourth NMOS transistor;
a cell of the plurality of cells includes a third PMOS transistor, a fourth PMOS transistor, a fifth NMOS transistor, a sixth NMOS transistor, a seventh NMOS transistor, and an eighth NMOS transistor;
the third PMOS transistor corresponds to the first PMOS transistor;
the fourth PMOS transistor corresponds to the second PMOS transistor;
the fifth NMOS transistor corresponds to the first NMOS transistor;
the sixth NMOS transistor corresponds to the second NMOS transistor;
the seventh NMOS transistor corresponds to the third NMOS transistor; and
the eight NMOS transistor corresponds to the fourth NMOS transistor.

7. The circuit of claim 5, wherein
a memory cell of the plurality of memory cells includes a first PMOS transistor, a second PMOS transistor, a first NMOS transistor, a second NMOS transistor, a third NMOS transistor, and a fourth NMOS transistor;
the plurality of cells includes a first-type cell and a second-type cell;
the first-type cell includes a third PMOS transistor, a fourth PMOS transistor, a fifth NMOS transistor, a sixth NMOS transistor, a seventh NMOS transistor, and an eighth NMOS transistor;
the third PMOS transistor corresponds to the first PMOS transistor;
the fourth PMOS transistor corresponds to the second PMOS transistor;
the fifth NMOS transistor corresponds to the first NMOS transistor;
the sixth NMOS transistor corresponds to the second NMOS transistor;
the seventh NMOS transistor corresponds to the third NMOS transistor;
the eight NMOS transistor corresponds to the fourth NMOS transistor;
the second-type cell includes a fifth PMOS transistor, a sixth PMOS transistor, a ninth NMOS transistor, a tenth NMOS transistor, an eleventh NMOS transistor, and a twelfth NMOS transistor;
the fifth PMOS transistor corresponds to the first PMOS transistor;
the sixth PMOS transistor corresponds to the second PMOS transistor;
the ninth NMOS transistor corresponds to the first NMOS transistor;
the tenth NMOS transistor corresponds to the second NMOS transistor;
the eleventh NMOS transistor corresponds to the third NMOS transistor; and
the twelfth NMOS transistor corresponds to the fourth NMOS transistor.

8. The circuit of claim 1, wherein
the switching circuit includes a first switching circuit and a second switching circuit;
the first switching circuit is configured to electrically connect and disconnect a bit line of the bit line circuit and a cell of the word line circuit; and
the second switching circuit is configured to electrically connect and disconnect a word line of the word line circuit and a cell of the bit line circuit.

9. The circuit of claim 8, wherein
at least one of the first switching circuit or the second switching circuit includes an NMOS transistor.

10. The circuit of claim 1, wherein
the switching circuit includes
a pass gate configured to receive a signal on a word line of the word line circuit;
a first NMOS transistor coupled with an output of the pass gate; and
a second NMOS transistor coupled with a bit line of the bit line circuit and a cell of the word line circuit.

11. The circuit of claim 1, wherein
the write signal generator circuit includes
a logic gate;
an NMOS transistor; and
an input of the logic gate is coupled with the NMOS transistor and with a cell of the word line circuit.

12. The circuit of claim 1, wherein
the write signal generator circuit includes
a NAND gate having at least two inputs;
at least two NMOS transistors; and
each input of the at least two inputs is coupled with an NMOS transistor of the at least two NMOS transistors and with a cell of the word line circuit.

13. The circuit of claim 1, wherein
the data circuit includes
a charging circuit configured to charge a bit line of the bit line circuit; and
a first circuit configured to provide a first bit line signal to the bit line of the bit line circuit or to receive a second bit line signal from the bit line of the bit line circuit.

14. The circuit of claim 13, wherein
the first circuit includes
a first inverter configured to receive a second clock signal generated from the clock generator circuit and to provide the first bit line signal; and
a second inverter configured to receive the second bit line signal and to provide the second signal.

15. A method comprising:
in a write operation of a memory macro,
generating, by operating at least a word line circuit and a bit line circuit, a first signal based on a first clock signal generated by a clock generator circuit;
a selection circuit selecting the first signal for use by the clock generator circuit; and
in a read operation of the memory macro,
generating, by operating at least the word line circuit and the bit line circuit, a second signal different from the first signal, based on a second clock signal generated by the clock generator circuit; and the selection circuit selecting the second signal for use by the clock generator circuit, wherein the clock generator circuit generates at least one of the first clock signal or the second clock signal based on the selected first signal or second signal.

16. A circuit in a memory macro, comprising:

a write path having a first signal generated based on a first edge of a clock signal in a write operation of the memory macro;

a read path having a second signal generated based on the first edge of the clock signal in a read operation of the memory macro;

a word line circuit, the write path, and the read path share the word line circuit;

a selection circuit configured
to select the first signal as a third signal in the write operation of the memory macro; and
to select the second signal as the third signal in the read operation of the memory macro; and a clock generator circuit configured to:
generate the first edge of the clock signal responsive to a reference clock signal; and
generate a second edge of the clock signal in the write operation or in the read operation, based on the third signal.

17. The circuit of claim 16, wherein
the memory macro includes a memory word line coupled with a plurality of memory cells;
the word line circuit includes at least one first-type cell and at least one second-type cell;
a number of the at least one first-type cell and of the at least one second-type cell equals to a number of the plurality of memory cells; and
the at least one first-type cell and the at least one second-type cell are coupled with a word line.

18. The circuit of claim 17, wherein
the write path further includes a first circuit configured to transfer a signal on a memory bit line of the memory macro to the at least one first-type cell.

19. The circuit of claim 16, wherein
the memory macro includes a memory bit line coupled with a plurality of memory cells;
the write path and the read path share a bit line circuit;
the bit line circuit includes at least one first-type cell and at least one second-type cell;
a number of the at least one first-type cell and of the at least one second-type cell equals to a number of the plurality of memory cells; and
the at least one first-type cell and the at least one second-type cell are coupled with a bit line.

20. The circuit of claim 19, wherein
the read path includes a first circuit configured to generate the second signal based on a signal on the memory bit line.

* * * * *